US010600462B2

(12) United States Patent
Augustine et al.

(10) Patent No.: US 10,600,462 B2
(45) Date of Patent: *Mar. 24, 2020

(54) BITCELL STATE RETENTION

(71) Applicant: INTEL CORPORATION, Santa Clara, CA (US)

(72) Inventors: Charles Augustine, Hillsboro, OR (US); Shigeki Tomishima, Portland, OR (US); James W. Tschanz, Portland, OR (US); Shih-Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 15/495,936

(22) Filed: Apr. 24, 2017

(65) Prior Publication Data

US 2017/0337958 A1    Nov. 23, 2017

Related U.S. Application Data

(63) Continuation of application No. 14/696,050, filed on Apr. 24, 2015, now Pat. No. 9,666,257.

(51) Int. Cl.
*G11C 11/00* (2006.01)
*G11C 11/16* (2006.01)

(52) U.S. Cl.
CPC ...... *G11C 11/1659* (2013.01); *G11C 11/1657* (2013.01); *G11C 11/1673* (2013.01); *G11C 11/1675* (2013.01); *G11C 11/1693* (2013.01)

(58) Field of Classification Search
CPC .................................................. G11C 13/0069
USPC ............................................................ 365/158
See application file for complete search history.

(56) References Cited

U.S. PATENT DOCUMENTS

| 7,545,662 | B2* | 6/2009 | Wang ..................... G11C 5/025 257/659 |
| 8,765,490 | B2* | 7/2014 | Zeng ....................... H01L 43/02 257/421 |
| 9,666,257 | B2* | 5/2017 | Augustine ........... G11C 11/1659 |
| 2002/0085411 | A1 | 7/2002 | Freitag et al. |
| 2004/0001353 | A1* | 1/2004 | Hidaka .................. G11C 11/15 365/171 |

(Continued)

OTHER PUBLICATIONS

Augustine, C. et al. "Ultra-Low Power Nanomagnet-Based Computing: A System-Level Perspective." IEEE Transactions on Nanotechnology. vol. 10, No. 4, Jul. 2011, 11 pp.

(Continued)

*Primary Examiner* — Min Huang
(74) *Attorney, Agent, or Firm* — Compass IP Law, PC

(57) ABSTRACT

In accordance with various embodiments of this disclosure, stray magnetic field mitigation in an MRAM memory such as a spin transfer torque (STT) random access memory (RAM), STTRAM is described. In one embodiment, retention of bitcell bit value storage states in an STTRAM may be facilitated by generating magnetic fields to compensate for stray magnetic fields which may cause bitcells of the memory to change state. In another embodiment, retention of bitcell bit value storage states in an STTRAM may be facilitated by selectively suspending access to a row of memory to temporarily terminate stray magnetic fields which may cause bitcells of the memory to change state. Other aspects are described herein.

18 Claims, 15 Drawing Sheets

(56) References Cited

U.S. PATENT DOCUMENTS

| | | |
|---|---|---|
| 2010/0220516 A1 | 9/2010 | Lee et al. |
| 2012/0063214 A1 | 3/2012 | Min et al. |
| 2013/0301340 A1* | 11/2013 | Park .................. G11C 13/0097 365/148 |
| 2014/0006704 A1 | 1/2014 | Greenfield et al. |
| 2014/0016397 A1 | 1/2014 | Lee et al. |
| 2014/0043924 A1 | 2/2014 | Kim et al. |
| 2014/0098592 A1 | 4/2014 | Lee |
| 2014/0156923 A1 | 6/2014 | Bains et al. |
| 2014/0160866 A1 | 6/2014 | Shur et al. |
| 2014/0177370 A1* | 6/2014 | Halbert ............ G11C 11/40603 365/222 |
| 2014/0281805 A1 | 9/2014 | Sah |
| 2015/0179254 A1* | 6/2015 | Alrod ................. G11C 13/0033 365/148 |
| 2015/0348603 A1* | 12/2015 | Lee .................... H03K 19/0005 365/189.07 |
| 2016/0093355 A1* | 3/2016 | Naeimi ................ G11C 11/161 365/158 |

OTHER PUBLICATIONS

English Translation of Search Report of R.O.C. Patent Application No. 105104946, dated Feb. 20, 2017, 1 page.

English Translation of Taiwan Notice of Allowance for Patent Application No. 105104946, dated Jun. 27, 2017, 1 page.

International Preliminary Report on Patentability, PCT/US2016/018800, dated Nov. 2, 2017, 7 pages.

International Search Report and Written Opinion for PCT Patent Application No. PCT/US2016/018800, dated Jun. 3, 2016, 10 pages.

Kim, Y. et al, "Flipping Bits in Memory Without Accessing Them: An Experimental Study of DRAM Disturbance Errors." Proceedings of the ACM/IEEE 41st International Symposium on Computer Architecture (ISCA). Jun. 2014, 12 pp.

Notice of Allowance for U.S. Appl. No. 14/696,050, dated Apr. 17, 2017, 2 pages.

Notice of Allowance for U.S. Appl. No. 14/696,050, dated Jan. 5, 2017, 7 pages.

Office Action for U.S. Appl. No. 14/696,050, dated Aug. 19, 2016, 7 pages.

Seaborn, M . Project Zero: Exploiting the DRAM Rowhammer Bug to Gain Kernal Privileges, [online]. Mar. 9, 2015, [Retrieved on Apr. 10, 2015]. Retrieved from the Internet at . 15 pp.

Arijit Raychowdhury: "Model study of 1T—1STT MTJ memory arrays for embedded applications", Circuits and Systems (MWSCAS), 2010 53rd IEEE International Midwest Symposium on, IEEE, Piscataway, NJ, USA, Aug. 16, 2010, pp. 5-8, XP031732713, ISBN: 978-1-4244-7771-5, p. 7, right-hand column, last paragraph—p. 8, left-hand column, paragraph 1; figure 8.

Charles Augustine et al: "Design Space Exploration of Typical STT MTJ Stacks in Memory Arrays in the Presence of Variability and Disturbances," IEEE Transactions on Electron Devices, IEEE Service Center, Pisacataway, NJ, US, vol. 58, No. 12, Nov. 23, 2011, pp. 4333-4343, XP011369503, ISSN: 0018-9383, DOI: 10.1109/TED.2011.2169962 p. 4342, left-hand column, last paragraph—right-hand column, paragraph 1.

Extended European Search Report for Patent Application No. 16783534.7, dated Oct. 29, 2018, 13 pages.

Kim Dae-Hyun et al: "Architectural Support for Mitigating Row Hammering in DRAM Memories," IEEE Computer Architecture Letters, IEEE, US, vol. 14, No. 1, Jun. 19, 2014, pp. 9-12, XP011585141, ISSN: 1556-6056, DOI: 10.1109/LCA.2014.2332177 [retrieved on Jun. 19, 2015] p. 9, left-hand column, paragraph 1 -p. 11, left-hand column, paragraph 2; figures 1-4.

* cited by examiner

| MODE | WORD LINE (WL) | BIT LINE (BL) | SOURCE LINE (SL) |
|---|---|---|---|
| READ | $V_{DD}$ | $V_{RD}$ | 0 |
| WRITE 0 (AP TO P) | $V_{DD}$ | $V_{DD}$ | 0 |
| WRITE 1 (P TO AP) | $V_{DD}$ | 0 | $V_{DD}$ |
| RETENTION | 0 | 0 | 0 |

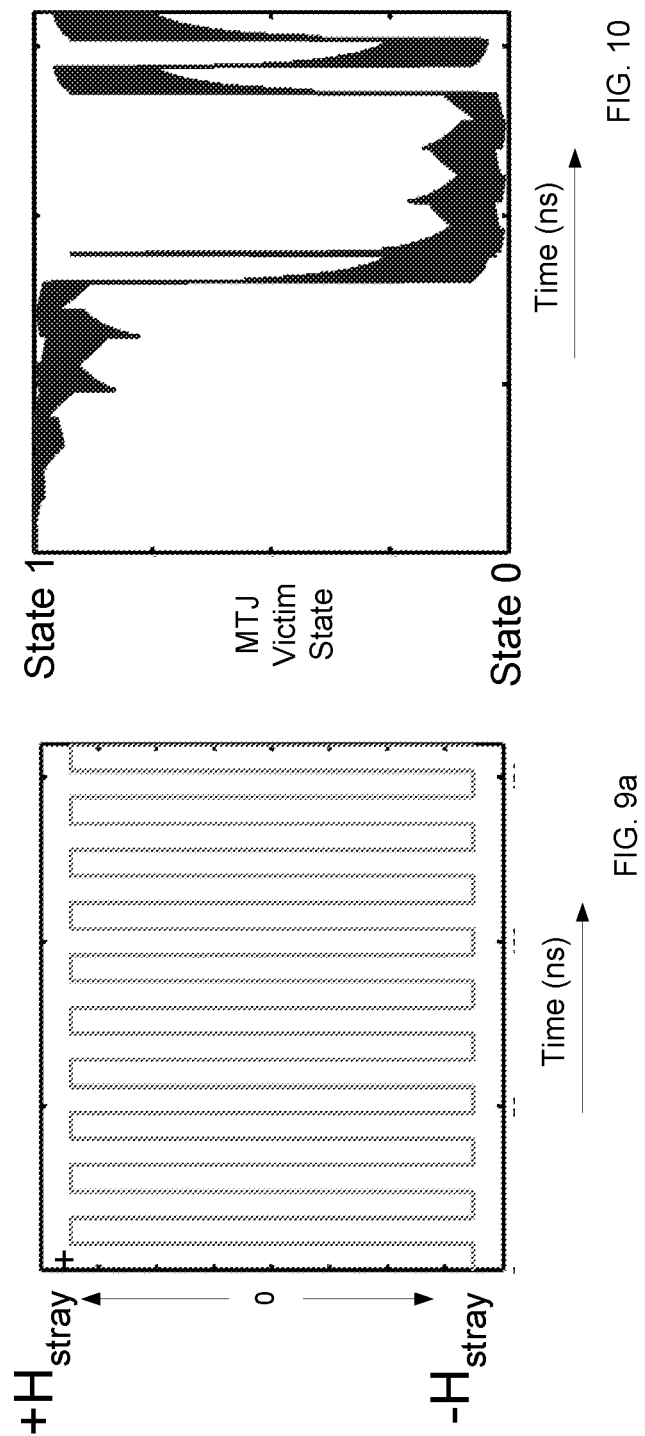

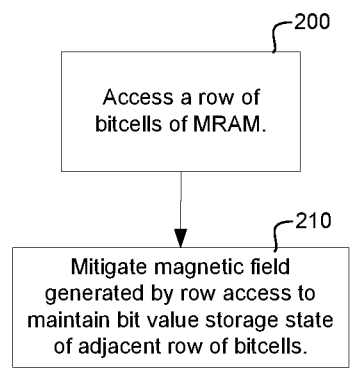
FIG. 11
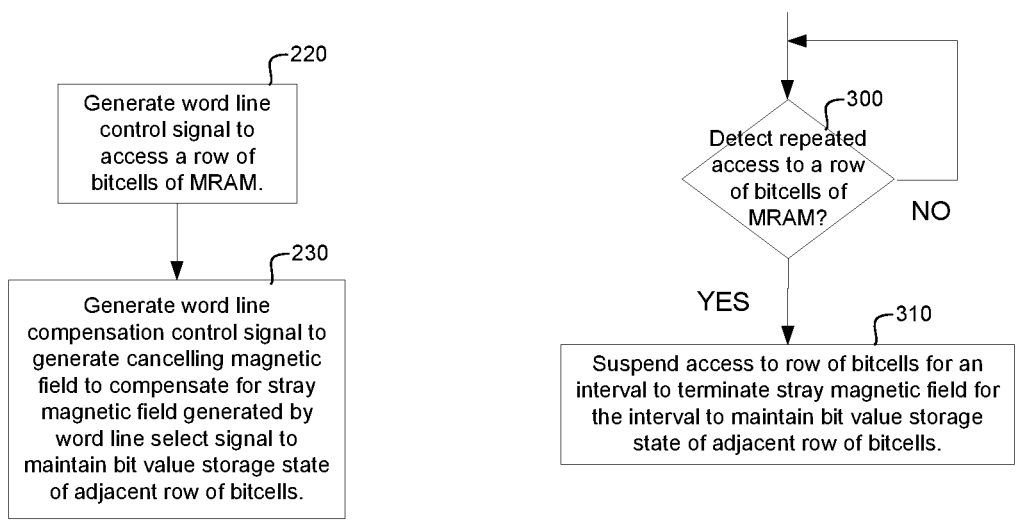
FIG. 12
FIG. 14

BITCELL STATE RETENTION

TECHNICAL FIELD

Certain embodiments of the present invention relate generally to non-volatile memory.

BACKGROUND

Memory devices frequently include bitcells arrayed in a matrix of rows and columns. Each bitcell stores a bit, the value of which depends upon the state of the bitcell. Thus, a bitcell typically has at least two bit value storage states in which in one bit value storage state, the bitcell state represents a logical 0 bit, and another bit value storage state which represents a logical 1 bit.

One or more bitcells of memory may fail to properly retain their bit value storage states due to various factors. In dynamic random access memory (DRAM), one such factor is a failure mechanism often referred to as "Row-hammer" (RH) in which bitcells may inadvertently change state due to accessing an adjacent row of bitcells repeatedly. For example, repeated access to one row, often referred to as the "attacker row" may cause bitcells in an adjacent row, often referred to as the "not-accessed" or "victim" row, to change bit value storage states due to the repetitive access to the attacker row. This row-hammer failure mechanism may be a problem both in terms of reliability degradation due to undetected data corruption, as well as security vulnerability should a malicious user purposefully flip bits in a victim row to gain unauthorized access to a restricted area of memory.

Spin Transfer Torque Random Access Memory (STTRAM) is a type of magnetoresistive Random Access Memory (MRAM) which is non-volatile and is typically used for memory circuits, such as, cache, memory, secondary storage, and other memory applications. The bitcells of STTRAM memory may be smaller and have greater durability as compared to the bitcells of other types of memory. Hence, STTRAM may be particularly suitable for on-die memory such as memory for a processor, and also off-die memories such as DRAM and non-volatile memories, such as Flash memory, and other applications. For example, STTRAM may be used to replace on-die memories such as Static Random Access Memory (SRAM) and embedded or enhanced Dynamic Random Access Memory (eDRAM). STTRAM memory also may often be operated at reduced power levels and may be less expensive as compared to other memory types.

BRIEF DESCRIPTION OF THE DRAWINGS

Embodiments of the present disclosure are illustrated by way of example, and not by way of limitation, in the figures of the accompanying drawings in which like reference numerals refer to similar elements.

FIG. 9a is a graph depicting one example of generation of oscillating stray magnetic fields which can row-hammer a row of bitcells.

FIG. 10 is a graph depicting one example of the bit value storage state of a bitcell flipping due to row-hammering, absent stray magnetic field mitigation for bitcell bit value storage state retention in accordance with an embodiment of the present disclosure.

FIG. 11 is a flow chart depicting one example of operations of stray magnetic field mitigation for bitcell bit value storage state retention in accordance with an embodiment of the present disclosure.

FIG. 12 is a flow chart depicting another example of operations of stray magnetic field mitigation for bitcell bit value storage state retention in accordance with an embodiment of the present disclosure.

FIG. 14 is a flow chart depicting yet another example of operations of stray magnetic field mitigation for bitcell bit value storage state retention in accordance with an embodiment of the present disclosure.

FIG. 17 is a graph depicting one example of operations of the programmable word line driver logic of FIG. 15, to terminate generation of oscillating stray magnetic fields by suspending access to a row of bitcells in accordance with an embodiment of the present disclosure.

FIG. 18 is a graph depicting one example of retaining the bit value storage state of a bitcell by suspending access to a row of bitcells in accordance with an embodiment of the present disclosure.

DESCRIPTION OF EMBODIMENTS

Figure 1:
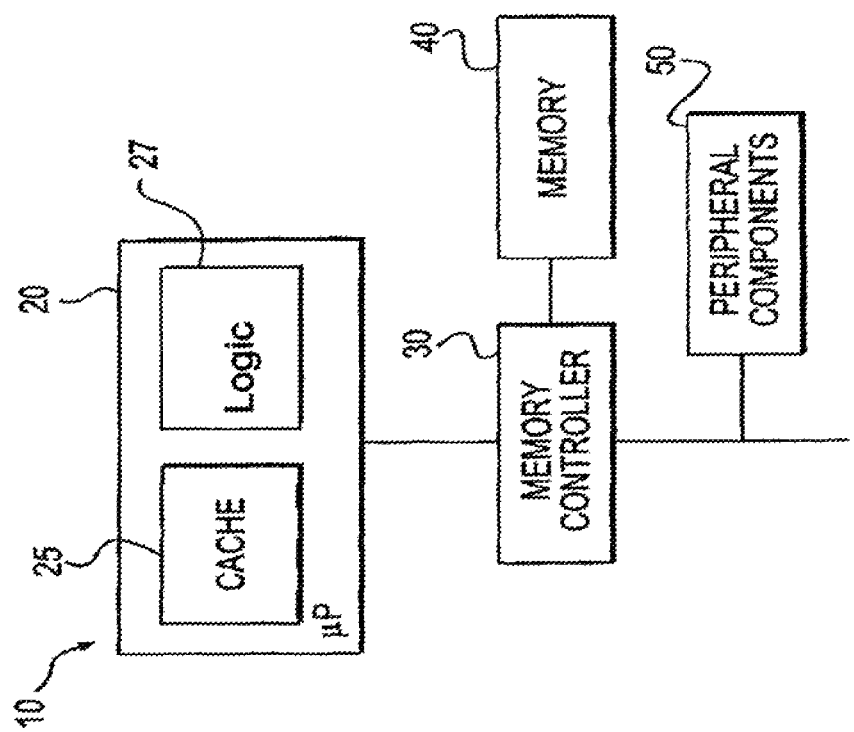
FIG. 1 depicts a high-level block diagram illustrating selected aspects of a system employing bitcell bit value storage state retention in accordance with an embodiment of the present disclosure.

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with various embodiments of this disclosure, stray magnetic field mitigation in an MRAM memory such as an STTRAM is described. In one embodiment, retention of bitcell bit value storage states in an STTRAM may be facilitated by generating magnetic fields to compensate for stray magnetic fields which may cause bitcells of the memory to change state. In another embodiment, retention of bitcell bit value storage states in an STTRAM may be facilitated by selectively suspending access to a row of memory to temporarily terminate stray magnetic fields which may cause bitcells of the memory to change state.

For example, it is recognized herein that absent bitcell bit value storage state retention in accordance with the present description, the states of bitcells in a victim row of STTRAM bitcells, may flip due to stray magnetic fields generated by repeated access to a nearby attacker row. In accordance with one aspect of the present description, such row-hammering stray magnetic fields may be effectively neutralized by generating an offsetting magnetic field to at least partially cancel stray magnetic fields. In this manner, the bit value storage states of the bitcells of the victim row may be protected from flipping due to row-hammer causing accesses to a nearby row of bitcells. In another aspect of the present description, such row-hammering stray magnetic fields may be effectively neutralized by selectively suspending access to a row of bitcells being accessed. As a result, generation of stray magnetic fields may be temporarily terminated before bit value storage states of the victim row flip due to causing accesses to a nearby row of bitcells.

In accordance with the present description, it is recognized that a primary contributor of stray magnetic fields in an MRAM memory such as an STTRAM is the current flowing in a memory control line often referred to as the Word Line (WL) control line. In one embodiment, to enhance retention of bitcell bit value storage states in an STTRAM, programmable WL driver logic is provided to mitigate stray magnetic fields row-hammering a row of bitcells. For example, upon selection of a particular address for a read or write operation for a row being accessed, that is, the "accessed" row, a word line (WL) control signal for the WL control line corresponding to the selected address is switched to a high state which turns on the switching transistors coupled to the WL control line. In one embodiment, a control signal on the WL control line may be raised to a high state designated $V_{ON}$ in this description, causing a current referred to herein as $I_{ON}$ to flow through the WL control line of the row adjacent to the row being row-hammered.

As a result of turning on the WL control line and the current flow associated with this change of state of the WL control line, a stray magnetic field $H_{stray}$ is generated. In accordance with the present description, the programmable WL driver logic can change the state of a WL control line of an adjacent row not being accessed (that is a "not-accessed" row), to an under-driven state in which the WL control line of the not-accessed row is under-driven to an opposite polarity voltage state designated $-V_{UND}$ in this description. Thus, in this embodiment, the under-driven state $-V_{UND}$ of the WL control line of the not-accessed row has the opposite polarity of the high state $V_{ON}$ of the WL control line of the accessed row. As a result of the change of state of the adjacent WL control line of the not-accessed row to the under-driven state, an opposite polarity current referred to herein as an under-drive current $-I_{UND}$ is generated which in turn generates an offsetting magnetic field $H_{cancel}$ to fully or partially cancel the stray magnetic field $H_{stray}$. Accordingly, retention of the bit value storage states of the bitcells of the not-accessed row may be facilitated not withstanding row-hammering of the row. Furthermore, the opposite polarity voltage $-V_{UND}$ on the WL control line of the not-accessed row may facilitate reducing leakage in bitcells of the not-accessed row.

Upon initiation of a write or other access operation, the generated stray magnetic field $H_{stray}$ may have a particular orientation represented as $+H_{stray}$. Upon completion of a write or other access operation of the row being accessed, the WL control signal changes to an off state, frequently represented by a zero voltage. As a result the transition from the $V_{ON}$ state to the zero or lower voltage state, a current $-I_{ON}$ of opposite polarity to the prior current $I_{ON}$ flows through the WL control line of the row being accessed. As a result, another stray magnetic field $-H_{stray}$ is generated but oriented in the opposite direction as that of the earlier stray magnetic field $+H_{stray}$.

In accordance with the present description, the programmable WL driver logic can again change the state of the WL control line of the adjacent row not being accessed (that is the "not-accessed" row), to another state, that is, an off state, for example, in which the WL control line of the not-accessed row is driven to a higher voltage state such as zero volts, for example. As a result of the change of state of the adjacent WL control line of the not-accessed row from the under-driven state $-V_{UND}$ to the higher voltage state such as zero volts, for example, a current $+I_{UND}$ (which is opposite in polarity to the under-drive current $-I_{UND}$) is generated which in turn generates an offsetting magnetic field $+H_{cancel}$ to fully or partially cancel the stray magnetic field $-H_{stray}$. Accordingly, retention of the states of the bitcells of the not-accessed row may again be facilitated not withstanding repeated access of a nearby row.

As previously mentioned, in another aspect of the present description, such row-hammering stray magnetic fields may be effectively neutralized by selectively suspending access to a row of bitcells being accessed. As a result, generation of stray magnetic fields may be temporarily terminated before states of the victim row flip due to row-hammer causing accesses to a nearby row of bitcells.

It is recognized herein that row-hammering an adjacent (not-accessed) row of STTRAM may cause the spin torque magnetization vector of one or more bitcells of the adjacent (not-accessed) row of STTRAM to begin to precess away from its original stable state. Thus, if the row-hammering of the nearby row continues for a sufficient period of time, the magnetization vector may precess sufficiently to flip the state of a bitcell of the not-accessed row.

In one embodiment of the present description, a programmable word line driver logic includes a detector configured to detect repeated access to a row of memory which may indicate that an adjacent (not-accessed) row is being hammered. For example, the detector may include a counter configured to count consecutive accesses to a particular row. The detector may further include a comparator configured to compare the count output of the counter to a threshold value as represented by the variable N, which may be programmable by the user in some embodiments. Control circuitry may be configured to suspend access to the particular row as a function of the comparison of the count output of the counter to the threshold value. For example, if access operations directed to the row equals the threshold value N, accesses to that row may be temporarily suspended. In one embodiment, the suspension period may be limited to a particular number of access cycles as represented by a variable M which may also be programmable by the user in some embodiments.

It is recognized herein that if access to the row causing row-hammering is suspended, the precession of the magnetization vector of the adjacent bitcell ceases and the precession of the magnetization vector reverses such that the state of the bitcell may return to its original stable state prior to flipping to a new stable bitcell bit value storage state. In this manner, a temporary suspension of operation for the row causing row-hammering for a suspension interval may be utilized to mitigate the spin torque precession and reduce the bit flip possibility of a row-hammer causing access pattern. In some embodiments, it is believed that suspending access for as few as a single access cycle (M=1) may reduce or eliminate bitcell state flipping due to row-hammering.

In one embodiment, suspension of memory access may be applied in the event that a detected row-hammer causing access exceeds certain row-hammering (RH) criteria. Conversely, if the detected memory access does not exceed the RH criteria, memory access suspension may be bypassed. As a result, impact upon memory performance may be reduced or eliminated, for normal memory access not involving row-hammering, and for memory access which otherwise does not exceed the RH criteria.

In other embodiments, instead of suspending access upon detection of row-hammering of a row, offsetting magnetic fields $H_{CANCEL}$, $-H_{CANCEL}$ may be selectively generated for a suitable limited period of time, such as M access cycles, for example, to cancel stray magnetic fields upon detection of row-hammering of a row. In still other embodiments, one or both techniques of access suspension and offsetting magnetic field generation may be selectively employed by a word line driver logic to singly or in combination mitigate bitcell state flipping due to row-hammering.

It is appreciated that suspension of operation may in some limited circumstances have an adverse effect upon performance. However, row-hammering is frequently associated with an abnormal or unsanctioned access pattern. Accordingly, suspension of operation may be warranted under such circumstances notwithstanding any potential adverse effect upon performance levels.

In another aspect of the present description, it is recognized that stray magnetic field mitigation in accordance with the present description may be employed for selected areas of memory which are more likely to be subjected to a row-hammering attack. Conversely, areas of memory which are not likely to be subjected to row-hammering, may be excluded, reducing impact on circuitry complexity and overhead.

In the illustrated embodiment, each bitcell of an STTRAM includes a magnetic tunnel junction (MTJ) device. The orientation of a magnetic layer in a magnetic tunnel junction (MTJ) device can be modified using a spin-polarized current. In STT-based MTJs, device resistance can be either low or high, depending on the relative angular difference between the directions of magnetic polarization on both sides of the tunnel junction.

In one embodiment, one bit value storage state of the bitcell is exhibited in which the ferromagnetic layers of the each MTJ have a parallel magnetic orientation and exhibit low resistance. Conversely, a second bit value storage state is exhibited in which the ferromagnetic layers of each MTJ have an anti-parallel magnetic orientation and exhibit high resistance. A logic value such as a "one" may be represented by the first (parallel orientation, low resistance) state, and a logic value such as a "zero" may be represented by the second (anti-parallel, high resistance) state. It is appreciated that in other embodiments, a logic value such as a "zero" may be represented by the first (parallel orientation, low resistance) state, and a logic value such as a "one" may be represented by the second (anti-parallel, high resistance) state.

It is appreciated that magnetic field mitigation techniques as described herein may be applied to MRAM devices other than STT MRAM devices such as giant magnetoresistance (GMR) MRAM, toggle MRAM and other MRAM devices. Such MRAM-based memory elements in accordance with embodiments described herein can be used either in stand-alone memory circuits or logic arrays, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

Turning to the figures, FIG. 1 is a high-level block diagram illustrating selected aspects of a system employing bitcell bit value storage state retention according to an embodiment of the present disclosure. System 10 may represent any of a number of electronic and/or computing devices, that may include a memory device. Such electronic and/or computing devices may include computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a microprocessor 20, a memory controller 30, a memory 40 and peripheral components 50 which may include, for example, video controller, input device, output device, storage, network adapter, etc. The microprocessor 20 includes a cache 25 that may be part of a memory hierarchy to store instructions and data, and the system memory 40 may also be part of the memory hierarchy. Communication between the microprocessor 20 and the memory 40 may be facilitated by the memory controller (or chipset) 30, which may also facilitate in communicating with the peripheral components 50.

Storage of the peripheral components 50 may be, for example, non-volatile storage, such as solid-state drives, magnetic disk drives, optical disk drives, a tape drive, flash memory, etc. The storage may comprise an internal storage device or an attached or network accessible storage. The microprocessor 20 is configured to write data in and read data from the memory 40 and storage 50. Programs in the storage are loaded into the memory and executed by the processor. A network controller or adapter enables communication with a network, such as an Ethernet, a Fiber Channel Arbitrated Loop, etc. Further, the architecture may, in certain embodiments, include a video controller configured to render information stored in memory on a display monitor, where the video controller may be embodied on a video card or integrated on integrated circuit components mounted on a motherboard or other substrate. An input device is used to provide user input to the processor, and may include a keyboard, mouse, pen-stylus, microphone, touch sensitive display screen, input pins, sockets, or any other activation or input mechanism known in the art. An output device is capable of rendering information transmitted from the processor, or other component, such as a display monitor, printer, storage, output pins, sockets, etc. The network adapter may embodied on a network card, such as a Peripheral Component Interconnect (PCI) card, PCI-express, or some other I/O card, or on integrated circuit components mounted on a motherboard or other substrate.

One or more of the components of the device 10 may be omitted, depending upon the particular application. For example, a network router may lack a video controller, for example.

Figure 2:
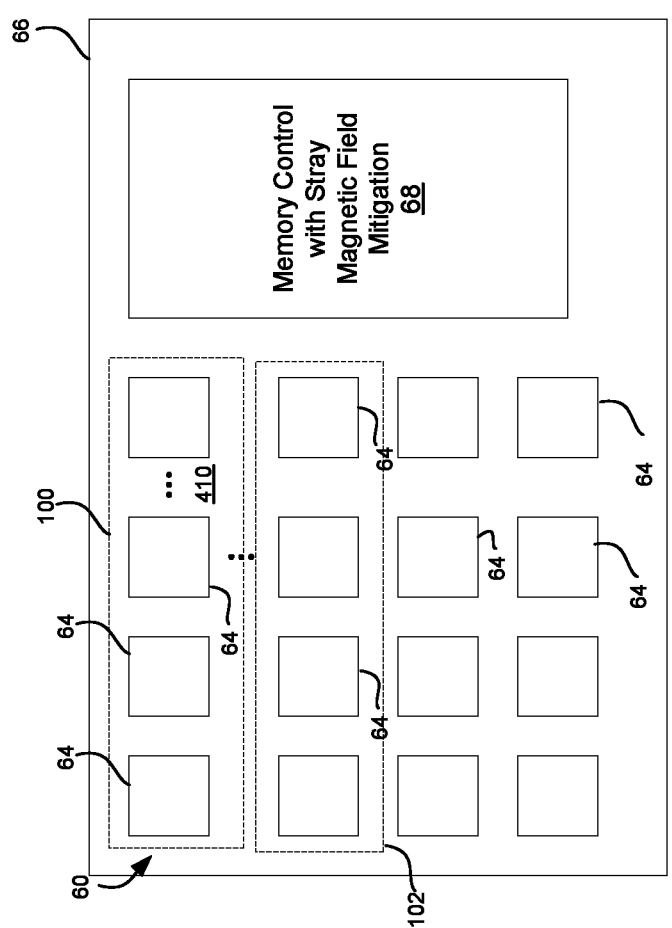
FIG. 2 depicts a basic architecture of an STTRAM memory employing stray magnetic field mitigation for bitcell bit value storage state retention in accordance with an embodiment of the present disclosure.

Any one or more of the memory devices 25, 40, and the other devices 10, 30, 50 may include an MRAM memory having stray magnetic field mitigation in accordance with the present description. FIG. 2 shows an example of an array 60 of rows and columns of bitcells 64 of an STT memory 66 in accordance with one embodiment of the present description. The STT memory 66 may also include a row decoder, a timer device and I/O devices (or I/O outputs). Bits of the same memory word may be separated from each other for efficient I/O design. A multiplexer (MUX) may be used to connect each column to the required circuitry during a READ operation. Another MUX may be used to connect each column to a write driver during a WRITE operation. A control circuit 68 performs stray magnetic field-mitigation operations and memory access operations such as read operations, and write operations to the bitcells 64 as explained below. The control circuit 68 is configured to perform the described operations using appropriate hardware, software or firmware, or various combinations thereof.

Figures 3A, 3B, 5:
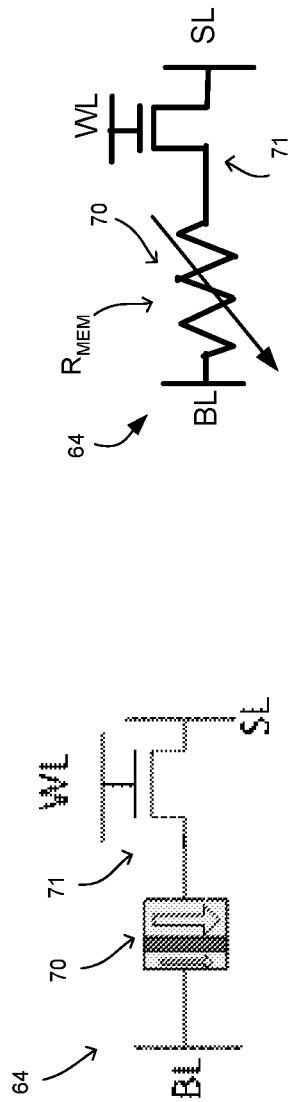
FIGS. 3a-3d are schematic diagrams of one example of a bitcell of the STTRAM memory of FIG. 2.
FIG. 5 is a chart depicting one example of read, write and retention voltages for a bitcell of the STTRAM memory of FIG. 2.
Figure 3D:
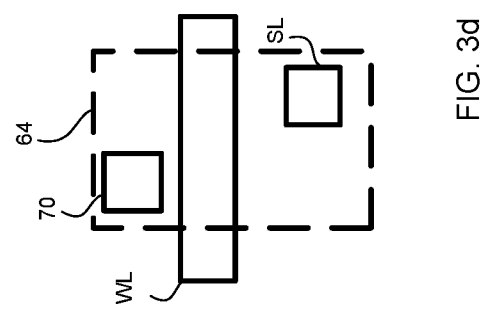
Figure 3C:
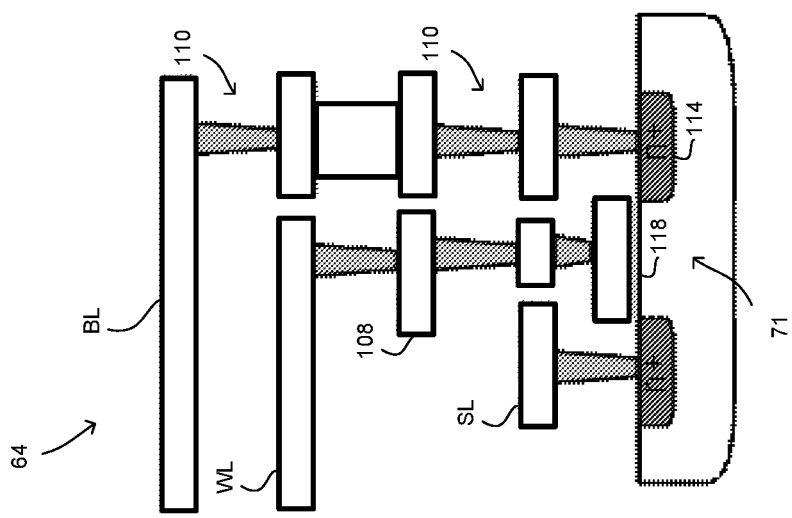
Figure 4B:
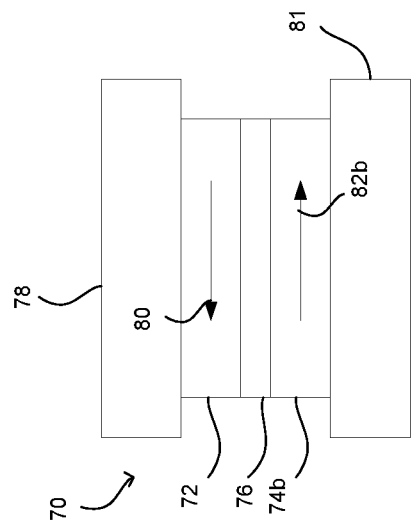
FIGS. 4a-4b depict examples of various polarizations of ferromagnetic layers of a magnetic tunneling junction (MTJ) device of a bitcell of FIGS. 3a-3d.
Figure 4A:
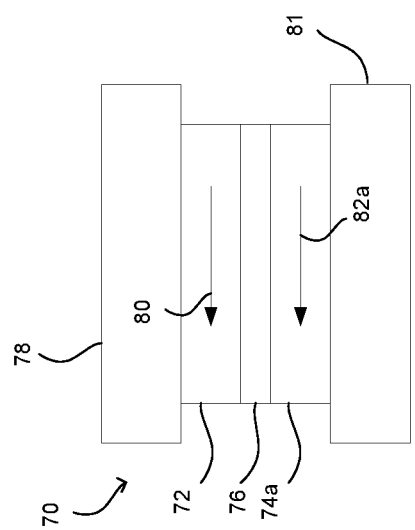

As shown in FIGS. 3a-3d, each STTRAM bitcell 64 of the illustrated embodiment includes a ferromagnetic device such as a magnetic tunneling junction (MTJ) device 70, a switching transistor 71 such as an NMOS transistor, and three control lines, that is, a bit line (BL), a source line (SL) and a word line (WL) for bitcell access operations including read and write operations. As best seen in FIGS. 4a, 4b, each ferromagnetic device 70 of a bitcell comprises two layers 72, 74a of ferromagnetic material separated by an intermediate layer 76 which is a metallic layer in the case of a spin valve or is a thin dielectric or insulating layer in the case of an MTJ. In this example, the layer 72 of ferromagnetic material is contacted by an electrical contact layer 78 and has a fixed polarization in which the magnetization direction which predominates, is fixed. Hence, the layer 72 is referred to as the fixed layer. The predominant magnetization direction of the fixed layer 72 has a magnetization direction represented by an arrow 80 pointing from right to left in the cross-sectional view of FIG. 4a.

The other layer 74a of ferromagnetic material is contacted by an electrical contact layer 81 and is referred to as the "free layer" which has a changeable polarization in which the predominant magnetization direction of the free layer may be selectively changed. The predominant magnetization direction of the free layer 74a is represented by an arrow 82a which also points from right to left in the cross-sectional view of FIG. 4a. In the embodiments of FIGS. 4a, 4b, the directions of magnetization as represented by the arrow 80, 82a, 82b are indicated as generally parallel to the intermediate layer 76. It is appreciated that in other MTJ devices, the directions of magnetization may have other orientations. For example, the directions of magnetization may be orthogonal to the intermediate layer 76.

In the example of FIG. 4a, the predominant magnetization directions of both the free and fixed layers 74a, 72 are depicted as being the same, that is in the same direction. If the predominant magnetization directions of the two ferromagnetic layers 72, 74a are the same, the polarizations of the two layers are referred to as being "parallel." In the parallel polarization, the bitcell exhibits a low resistance state which may be selected to represent one of a logical one or a logical zero stored in the bitcell. If the predominant magnetization directions of the two ferromagnetic layers are opposite as shown by the arrows 80 (right to left) and 82b (left to right) in FIG. 4b, the polarizations of the two layers 72, 74b are referred to as being "anti-parallel." In the anti-parallel polarization, the bitcell exhibits a high resistance state which may be selected to represent the other one of a logical one or a logical zero stored in the bitcell. Accordingly the MTJ device 70 of each bitcell 64 may be represented schematically by a variable resistor $R_{mem}$ as shown in FIG. 3b.

The polarization and hence the logical bit value stored in a bitcell 64 of an STTRAM 66 may be set to a particular bit value storage state by passing a spin polarized current in a particular direction through the ferromagnetic device 70 of the bitcell 64. A spin polarized current is one in which the spin orientations of the charge carriers (such as electrons) are predominantly of one type, either spin up or spin down. Thus, the control circuit 68 (FIG. 2) is configured to store a logical one in a bitcell 64 of an STTRAM 66 by passing spin polarized current in one direction through the ferromagnetic device 70 of the bitcell 64. As a result, the ferromagnetic layers of the ferromagnetic device 70 of the bitcell 64 have a polarization which is one of parallel or antiparallel, depending upon which polarization state has been selected to represent a logical one.

Conversely, a logical zero may be stored in a bitcell 64 of an STTRAM 66 by the control circuit 68 passing spin polarized current in the opposite direction through the ferromagnetic device 70 of the bitcell. As a result, the ferromagnetic layers of the ferromagnetic device 70 of the bitcell 64 have a polarization which is the other of parallel or antiparallel, depending upon which polarization has been selected to represent a logical zero.

Thus, the bitcell 64 of FIGS. 3a-3d is written to by passing current through the magnetic tunneling junction (MTJ) device 70 and the direction of the current determines the bit value storage state of the MTJ device 70. For example: current from bit line BL to source line SL will switch the MTJ device 70 to the parallel (P) polarization direction and a current from source line SL to bit line BL will switch the MTJ device 70 to the anti-parallel (AP) polarization direction if the current is applied for a sufficient duration of time (switching-time).

In accordance with the present description, it is appreciated that in addition to the current flowing through the MTJ device 70, the state of the MTJ device 70 may also be affected by a magnetic field such as a stray magnetic field applied on the MTJ device 70. Hence, in one aspect of the present description, control of the state of the MTJ device 70 may be improved by reducing or eliminating the effect of stray magnetic fields being applied on the MTJ device 70.

In one embodiment, the bitcell 64 may be read by precharging the bit line BL to $V_{RD}$ and allowing it to decay through the cell when the word line WL is strobed with the voltage $V_{DD}$. As shown in the chart of FIG. 5, which turns on the switching transistor 71. A sense amplifier reference voltage may be simultaneously drained using a reference cell. Both the reference and the accessed bit lines BL may be clamped using a PMOS current source, so that a constant differential is maintained at the sense amplifier input even for very long access times.

In this example, a logical one is represented by a high resistance state (antiparallel polarization (FIG. 4b) of the variable resistive element $R_{mem}$ (FIG. 3b) which is the magnetic tunnel junction (MTJ) device 70. Conversely a logical zero is represented in this example by a low resistance state (parallel polarization (FIG. 4a) of the variable resistive element $R_{mem}$ which is the magnetic tunnel junction (MTJ) device 70. Accordingly, if the precharge voltage $V_{RD}$ decays to a relatively high value, a logical 1 (high resistance state) is indicated as being stored in the MTJ device 70. Conversely, if the precharge voltage $V_{RD}$ decays to a relatively low value, a logical 0 (low resistance state) is indicated as being stored in the MTJ device 70. (It is appreciated that in other embodiments, a logical 1 may be represented by a low resistance state (parallel polarization (FIG. 4a)) of the variable resistive transistor element $R_{mem}$. Conversely a logical 0 may be represented by a high resistance state (anti-parallel polarization (FIG. 4b)) of the variable resistive transistor element $R_{mem}$.)

To write into the bitcell 64, a bidirectional writing scheme controlled by the control circuit 68 (FIG. 2) is used. To write a logical 0 in which the bit value storage state of the MTJ device 70 represented as the variable resistive element $R_{mem}$ changes from the anti-parallel state (FIG. 4b) to the parallel state (FIG. 4a), bit line BL is charged to $V_{DD}$ and source line SL is connected to ground so that a current is flowing from the bit line BL to the source line SL. Conversely, to write a logical 1 in which the state of the variable resistive element $R_{mem}$ changes from the parallel state (FIG. 4a to the anti-parallel state (FIG. 4b), a current with opposite direction is utilized. Accordingly, source line SL at $V_{DD}$ and bit line BL at ground causes current to flow from the source line SL to the bit line BL, that is, the opposite direction. Upon completion of the memory access operation to the bitcell 64, the source line SL, bit line BL and word line WL of the bitcells 64 of the row being accessed are maintained in an off state such as zero volts, for example as shown in FIG. 5, to retain the bitcell bit value storage states of the bitcells of the row being accessed.

However, it is recognized that, in the absence of bitcell state retention in accordance with the present description, currents passing through conductors of the memory 66 may generate stray magnetic fields which can disrupt operation of the memory 66. For example currents generated in conductors such as the word line WL, bit line BL or the source line SL to access one bitcell in read or write operations, may generate stray magnetic fields of sufficient strength to flip the bit value storage state of an adjacent bitcell, particularly as bitcell integration grows increasing dense.

In the embodiment of FIG. 3a, the MTJ device 70 is shown having the free layer coupled to the bitcell control line BL and the fixed layer coupled to the switching transistor 71. However, it is appreciated that in other embodiments, such an arrangement may be reversed with the free layer coupled to the switching transistor 71 and the fixed layer coupled to the bitcell control line BL.

Figure 6:
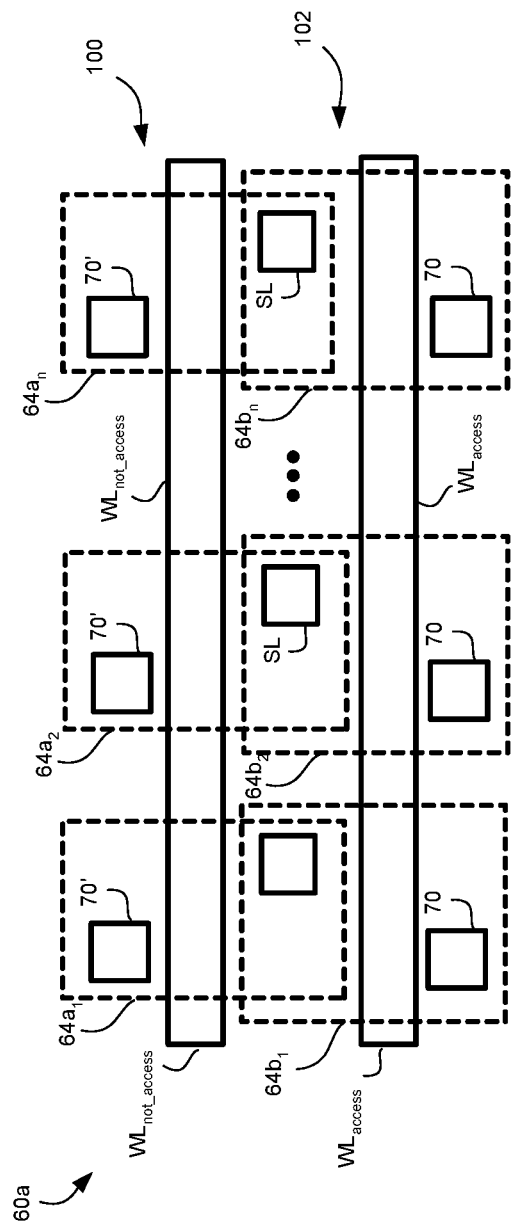
FIG. 6 is a top view schematic representation of adjacent rows of bitcells of the STTRAM memory of FIG. 2.

FIG. 6 is a schematic diagram depicting a portion 60a of the array 60 of bitcells 64 of the memory 66 (FIG. 2). As best seen in FIG. 2, the array 60 includes a first row 100 of bitcells 64 and a second, adjacent row 102 of bitcells 64.

FIG. 6 depicts row 100 as including bitcells represented by the bitcells $64a_1$, $64a_2$ ... $64a_n$, each of which includes an MTJ device 70'. Similarly the adjacent row 102 is depicted as including bitcells represented by the bitcells $64b_1$, $64b_2$ ... $64b_n$, each of which includes an MTJ device 70. In the example of FIGS. 3c and 6, the bitcells and their components are relatively densely integrated. Thus, adjacent bitcells and the components of adjacent bitcells including MTJ devices 70, 70', conductor metallization control lines 108 (FIG. 3c) such as the bit lines (BL), word lines (WL) and source lines (SL), for example, vias 110 between layers, and doped regions 114 and layers 118 of switching transistors 71 may be relatively closely spaced together. It is appreciated that other embodiments may be integrated to a greater or lesser density, depending upon the particular application.

Due to various factors such as dense integration in some embodiments, a significant amount of stray magnetic fields may be applied to components of the bitcells including the MTJ devices 70'. Such stray magnetic fields may be generated by current carrying conductors such as the bit lines BL, source lines SL and word lines WL, for example. In accordance with the present description, it is recognized that a primary contributor of stray magnetic fields in an MRAM memory such as an STTRAM is due to the current flowing in the Word Line (WL) control line. In the example of FIG. 6, the row 102 of bitcells $64b_1$, $64b_2$ ... $64b_n$. represents a row being accessed in a manner causing row-hammering to an adjacent row. The adjacent row of bitcells $64a_1$, $64a_2$ ... $64a_n$ being row-hammered is not being accessed. Hence, the word line for the row 100 is labeled $WL_{not\_access}$. Conversely, the word line for the row 102 which is being accessed is labeled $WL_{access}$.

Figure 7:
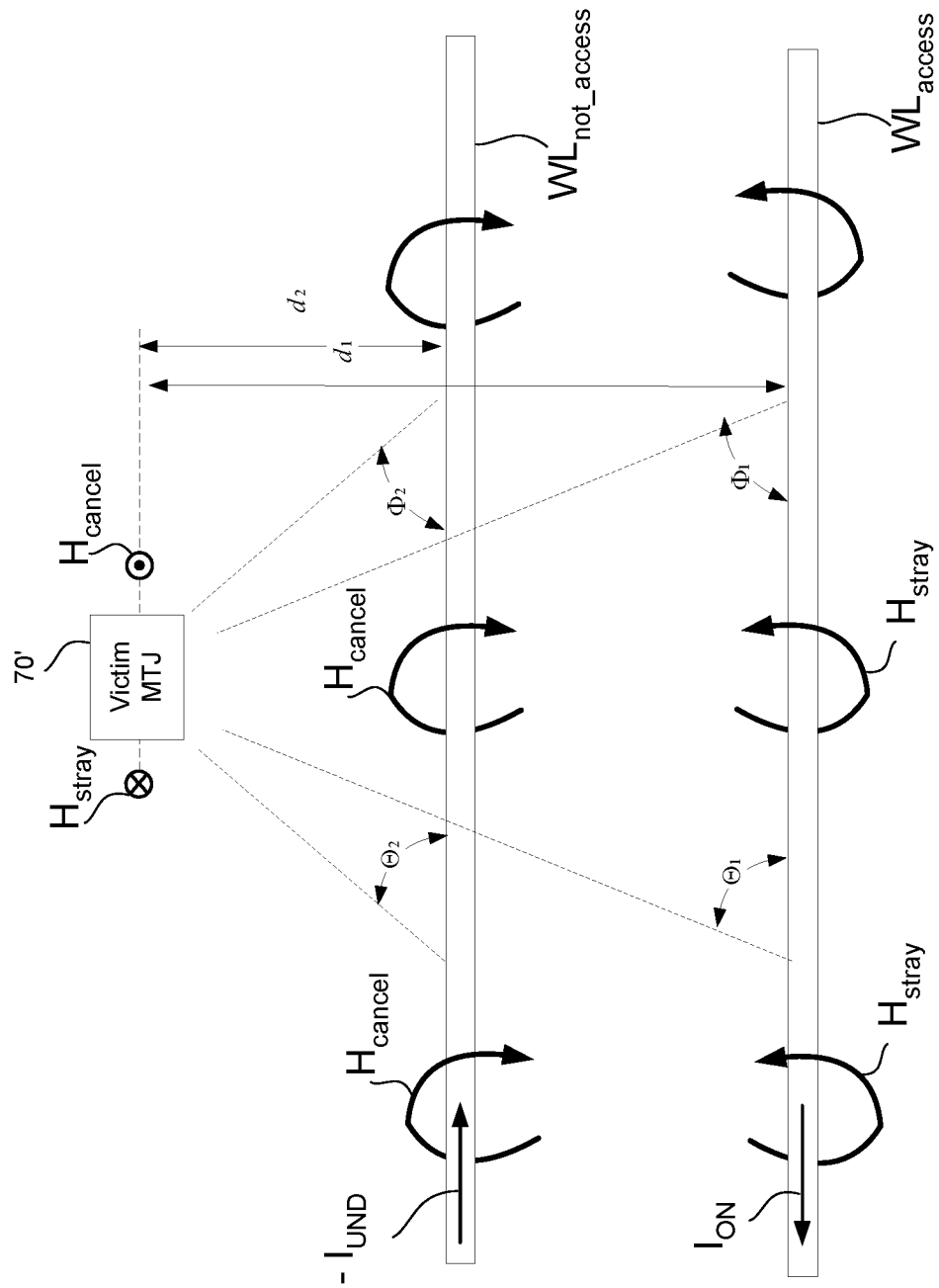
FIG. 7 is a schematic diagram depicting one example of generation of cancelling magnetic fields for stray magnetic field mitigation for bitcell bit value storage state retention in accordance with an embodiment of the present disclosure.
Figure 8:
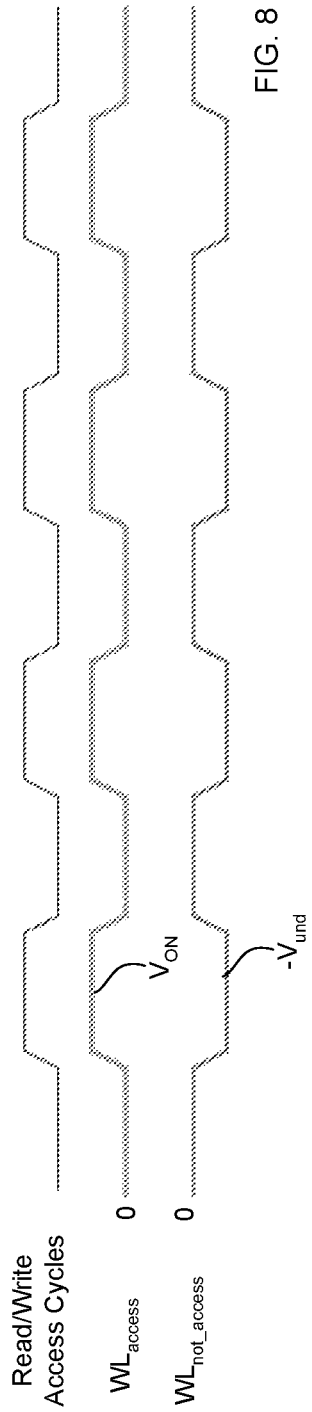
FIG. 8 is a graph depicting one example of generation of a word line compensation control signal in accordance with an embodiment of the present disclosure, to cause the generation of a cancelling magnetic field to compensate for stray magnetic fields to maintain bit value storage bit value storage state of an adjacent row of bitcells.

FIG. 7 depicts a stray magnetic field $H_{stray}$ being generated due to current flowing in the Word Line (WL) control line $WL_{access}$ of the row 102 (FIG. 6). FIG. 8 depicts sequential memory access cycles in which a particular address of the row 102 (FIG. 6) is accessed in sequential read or write operations. In each memory access cycle, upon selection of a particular address for a read or write operation for the row 102 being accessed, that is, the "accessed" row, a word line (WL) control signal carried by the WL control line $WL_{access}$ of the selected address is switched to a high state $V_{ON}$ as shown in FIG. 8, which turns on the switching transistors 71 (FIGS. 3a-3d) coupled to the WL control line. Due to the transition to the high state $V_{ON}$, a current referred to herein as $I_{ON}$ (FIG. 7) flows through the control line $WL_{access}$ of the row 102 being accessed.

As a the result of the turn on current $I_{ON}$ flowing through the WL control line $WL_{access}$, a stray magnetic field $H_{stray}$ is generated in accordance with the Biot-Savart law as shown in FIG. 7. The strength of the stray magnetic field $H_{stray}$ upon an adjacent ("victim") MTJ device 70' of the adjacent row 100 (FIG. 6) not being accessed may be calculated as a function of the distance variables $d_1$, $\cos\theta_1$, $\cos\varphi_1$ (FIG. 7) between the victim MTJ device 70' and the WL control line $WL_{access}$ of the row 102 being accessed, as:

$$H_{stray} = \frac{I_{ON}(\cos\theta_1 + \cos\varphi_1)}{4\pi d_1}$$

FIG. 9a shows an example of calculated stray magnetic field strengths which have been simplified by assuming an infinite wire ($\theta_1 = \varphi_1 = 0$) for a given current $I_{ON}$ and conductor to MTJ device distance $d_1$. Absent stray magnetic field mitigation in accordance with the present description, the stray magnetic field $H_{stray}$ can cause a victim MTJ device 70' to switch its bit value storage state from a parallel orientation, low resistance state, to an anti-parallel orientation, high resistance state, or vice-versa. Such state switching is enhanced by a bi-directional current flow through a conductor such as the WL control line $WL_{access}$, which can generate stray magnetic fields ($+H_{stray}$, $-H_{stray}$) which are oscillating in nature as shown in FIG. 9a. For example, when WL control line $WL_{access}$, is activated in a memory read/write access cycle to read values from or write values to the bitcells of the accessed row 102, current flows through the WL control line $WL_{access}$, to charge the capacitance present in the WL control line $WL_{access}$, from '0' to $V_{ON}$ as shown in FIG. 8. In the example of FIG. 5, the voltage $V_{ON}$ is represented as the voltage $V_{DD}$. It is recognized that the voltage $V_{ON}$ may have other values and sources, depending upon the particular application.

As a result of the current flow initiated in the memory access cycle, the magnetic field $H_{stray}$ is generated and flows through the victim MTJ device 70' as shown in FIG. 7. As the memory read (or write) access is terminated, the WL control line $WL_{access}$ is deactivated and a discharge current (which may be represented as $-I_{ON}$) flows in the opposite direction and generates a stray magnetic field (which may be represented as $-H_{stray}$) which flows through the victim MTJ device 70' in the opposite direction. Sequential and repeated application of $+H_{stray}$ followed by $-H_{stray}$ as depicted in FIG. 9a provides an oscillating stray magnetic field which can result in switching the bit value storage state of the victim MTJ device 70' as depicted in FIG. 10.

For example, the it is recognized herein that the polarization directions of the victim MTJ device 70' may oscillate in response to an applied oscillating stray magnetic field. Hence, the bitcell bit value storage states may oscillate as well as long as the oscillating stray magnetic field is applied. As a result, the final bit value storage state of the victim bitcell may depend upon the last bit value storage state of the bitcell at the time the oscillating stray magnetic field ceased. Hence, depending upon when the row-hammering oscillating stray magnetic field ceased, the resultant bit value storage state of the victim bitcell may be the correct state or the incorrect state.

It is further recognized that the susceptibility of MTJ devices to flipping bit value storage states may be a function of parametric process variations. Hence, the states of some MTJ devices may be more easily flipped by weaker stray magnetic fields than other MTJ devices. It is further appreciated that heat generated by continuous, repeated access of the memory array, may reduce the stray magnetic field strength required for flipping the MTJ device states.

Accordingly, absent stray magnetic field mitigation in accordance with the present description, reliability of the memory may be adversely affected by row-hammering or other memory access patterns generating excessive stray magnetic fields. In addition, row-hammering may adversely affect data security should such row hammering facilitate writing in memory rows not permitted by a security policy. Thus, absent stray magnetic field mitigation in accordance with the present description, it is recognized that a hacker may be able to write to unauthorized memory locations.

FIG. 11 depicts one example of bitcell bit value storage state retention operations in accordance with the present description. In one operation, a row of bitcells of a memory such as MRAM is accessed (block 200). As described above, such access can generate stray magnetic fields which, absent bitcell state retention in accordance with the present description, can cause bitcell states of victim bitcells to change bit value storage states, with a resultant loss in reliability or data security. In the embodiment of FIG. 11, the memory is configured to mitigate (block 210) stray magnetic fields to maintain bit value storage states of memory rows adjacent to the row being accessed (block 200).

FIG. 12 depicts one example of bitcell bit value storage state retention operations which include one embodiment of magnetic field mitigation operations in accordance with the present description. In this example, a word line (WL) control signal such as that depicted for the WL control line $WL_{access}$ (FIG. 8) is generated (block 220) to access a bitcell such as one or more of the bitcells $64b_1, 64b_2 \ldots 64b_n$ (FIG. 6), of the row 102. As noted above, such access can generate stray magnetic fields $+H_{stray}$, $-H_{stray}$, which, absent bitcell bit value storage state retention in accordance with the present description, can cause bitcell states of victim bitcells such as bitcells $64a_1, 64a_2 \ldots 64a_n$, (FIG. 6) to change bit value storage states, as depicted in FIG. 10.

In one embodiment of magnetic field mitigation in accordance with the present description, a word line compensation control signal may be generated (block 230, FIG. 12) to cause the generation of a cancelling magnetic field to compensate for stray magnetic fields to maintain bit value storage state of adjacent row of bitcells. FIG. 8 depicts one example of a such a word line compensation control signal for the WL control line $WL_{not\_access}$ which is generated by a word line driver circuit logic, such as a programmable word line driver logic 240 of the memory 66 of FIG. 13. FIG. 7 depicts one example of a magnetic field $H_{cancel}$ generated in response to the word line compensation control signal for the WL control line $WL_{not\_access}$.

As previously mentioned, in each memory access cycle (FIG. 8) of a row causing row-hammering, the word line (WL) control signal carried by the WL control line $WL_{access}$ of the selected address is switched to a high state $V_{ON}$ and the capacitance charging current $I_{ON}$ (FIG. 7) flows through the control line $WL_{access}$ of the row 102 being accessed. As a the result of the turn on current $I_{ON}$ flowing through the WL control line $WL_{access}$, a stray magnetic field $H_{stray}$ is generated.

Figure 13:
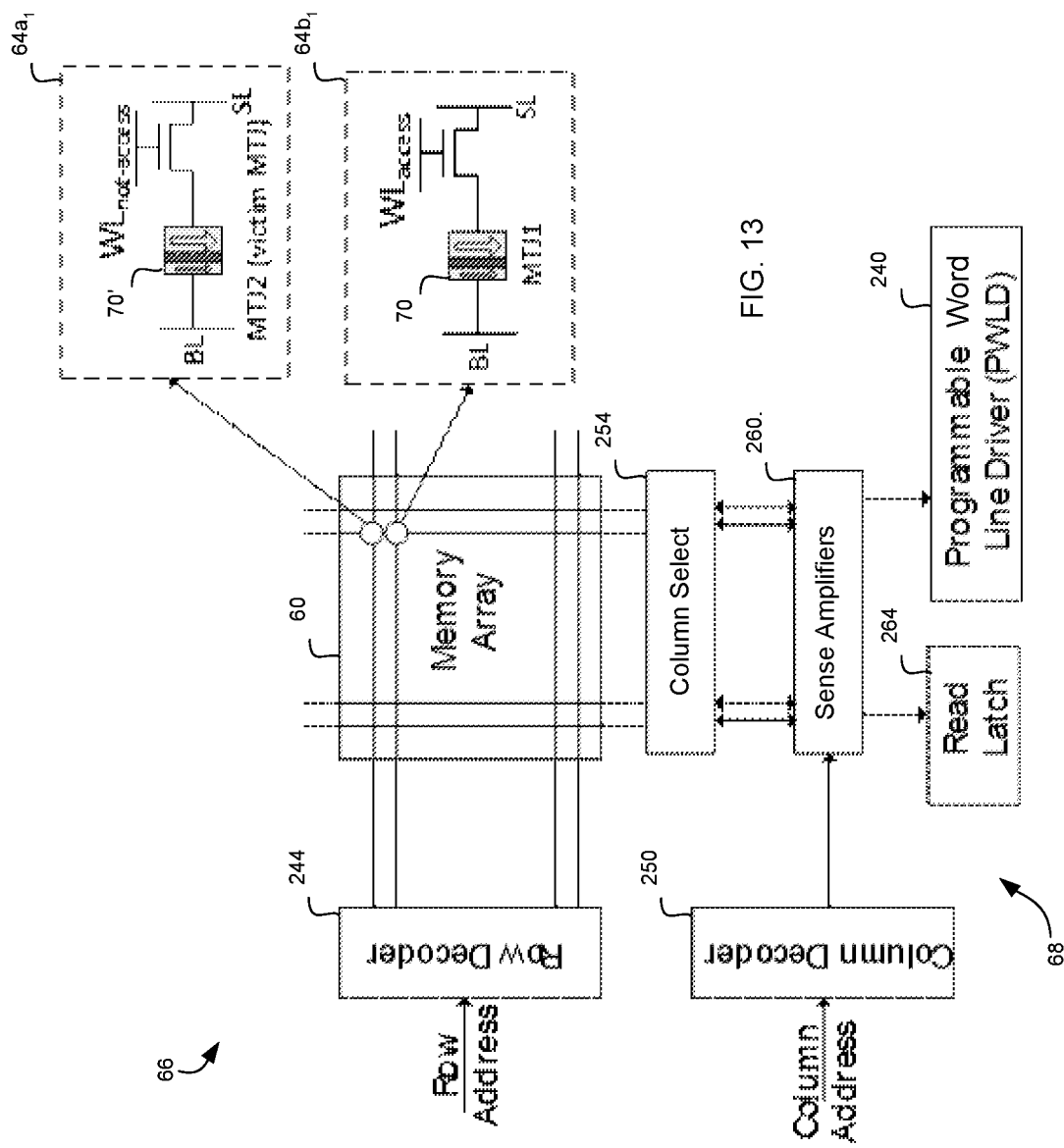
FIG. 13 is a more detailed schematic diagram of the memory control circuit of the STTRAM memory of FIG. 2.

In the memory 66 of FIG. 13, one or more of the bitcells $64b_1, 64b_2 \ldots 64b_n$ (FIG. 6) of the row 102 may be selected for a memory read or write access operation by providing a memory address which includes a row address of the row 102 and a column address of one or more of the bitcells $64a_1, 64a_2 \ldots 64a_n$ as represented by the bitcell $64b_1$ of FIG. 13. The row address is decoded by row address decoder logic 244 to select a particular word line such as WL control line $WL_{access}$ of the row 102. The column address is decoded by column address decoder logic 250 to select a particular bit line (BL) using column select logic 254 and sense amplifiers 260. The bit value stored in an accessed bitcell may be read and latched in a read latch 264.

To compensate for the generation of stray magnetic fields in each access cycle, a compensation control signal is generated by the programmable word line driver 240 during each memory access cycle. The generated compensation control signal is applied to the word line of one or more adjacent rows which are not being accessed as represented by the WL control line $WL_{not\_access}$ (FIG. 8) of the row 100 (FIG. 6). Accordingly, upon selection of a particular address for a read or write operation for the row 102 being accessed in a memory access cycle, that is, the "accessed" row, a compensation control signal carried by the WL control line $WL_{not\_access}$ of the selected address is switched to an under-driven state $-V_{UND}$ as shown in FIG. 8. Thus, in this embodiment, the under-driven state $-V_{UND}$ of the WL control line of the not-accessed row has the opposite polarity of the high state $V_{ON}$ of the WL control line of the accessed row. Due to the transition to the under-driven state $-V_{UND}$, a capacitance charging current referred to herein as $-I_{UND}$ (FIG. 7) flows through the control line $WL_{not\_access}$ of the row 100 not being accessed. Thus, in this embodiment, the current $-I_{UND}$ of the WL control line of the not-accessed row has the opposite polarity of current $I_{ON}$ of the WL control line of the accessed row.

As a the result of the compensation current $-I_{UND}$ flowing through the WL control line $WL_{not\_access}$, a cancelling magnetic field $H_{cancel}$ is generated in accordance with the Biot-Savart law as shown in FIG. 7. The strength of the cancelling magnetic field $H_{cancel}$ upon an adjacent ("victim") MTJ device 70' of the adjacent row 100 (FIG. 6) not being accessed may be calculated as a function of the distance variables $d_2$, $\cos\theta_2$, $\cos\varphi_2$ (FIG. 7) between the victim MTJ device 70' and the WL control line $WL_{not\_access}$ of the row 100 not being accessed, as:

$$H_{cancel} = \frac{-I_{UND}(\cos\theta_2 + \cos\varphi_2)}{4\pi d_2}$$

Figure 9B:
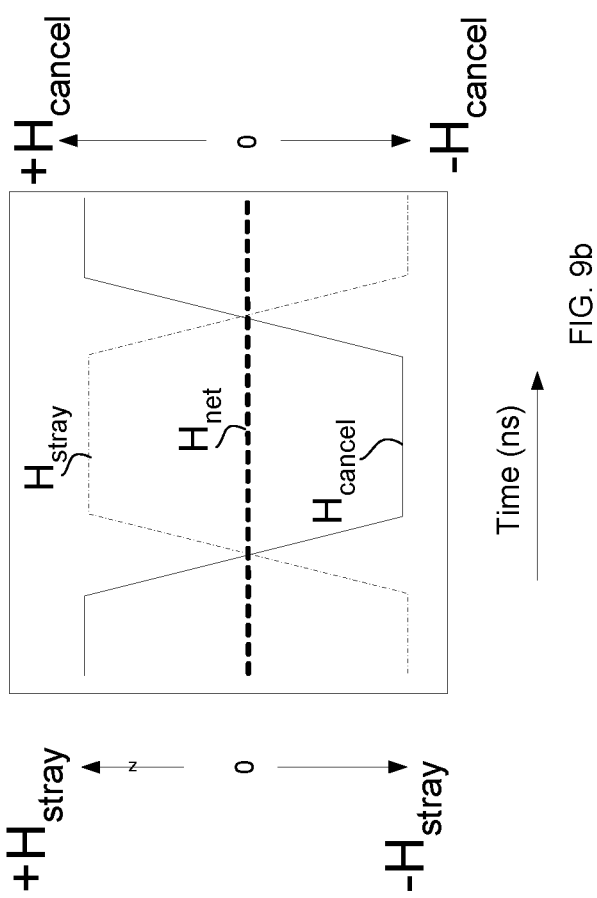
FIG. 9b is a graph depicting one example of generation of cancelling magnetic fields for stray magnetic field mitigation for bitcell bit value storage state retention in accordance with an embodiment of the present disclosure.

Accordingly, the magnitude and polarity of the under-driven state $-V_{UND}$ and the resultant current $-I_{UND}$ (FIG. 7) flowing through the control line $WL_{not\_access}$ of the row 100 not being accessed, may be selected to provide a resultant cancelling magnetic field $H_{cancel}$ which fully or at least partially compensates for the stray magnetic field $H_{stray}$ upon an adjacent ("victim") MTJ device 70' of the adjacent row 100 (FIG. 6) not being accessed. For example, FIG. 9b depicts a cancelling magnetic field $H_{cancel}$ of appropriate polarity and magnitude to offset the stray magnetic field $H_{stray}$ upon an adjacent ("victim") MTJ device 70', and to produce a net magnetic field $H_{net}$ at or near zero in strength. In one embodiment, the programmable word line driver logic 240 may be programmed to provide compensation control signals of appropriate polarity and magnitude to offset the stray magnetic field $H_{stray}$ upon an adjacent ("victim") MTJ device 70', and to produce a net magnetic field $H_{net}$ which is sufficiently low to reduce or eliminate bitcell state switching due to row hammering.

As previously mentioned, as the memory read (or write) access is terminated, the WL control line $WL_{access}$ is deactivated and a capacitance discharging current (which may be represented as $-I_{ON}$) flows in the opposite direction as the prior current $+I_{ON}$, and generates a stray magnetic field (which may be represented as $-H_{stray}$ which flows through the victim MTJ device 70' in the opposite direction of the prior stray magnetic field $+H_{stray}$. Sequential application of $+H_{stray}$ followed by $-H_{stray}$ as depicted in FIG. 9a provides an oscillating stray magnetic field $H_{stray}$ which can result in switching the bit value storage state of the victim MTJ device 70' as depicted in FIG. 10.

As previously mentioned, a compensation control signal is generated by the programmable word line driver 240 during each memory access cycle and applied to the word line of one or more adjacent rows which are not being accessed as represented by the WL control line $WL_{not\_access}$ (FIG. 8) of the row 100 (FIG. 6). Accordingly, as the WL control line $WL_{access}$ is deactivated and the current $-I_{ON}$ flows and generates the stray magnetic field $-H_{stray}$, the WL control line $WL_{not\_access}$ is similarly deactivated and a capacitance discharging compensation current (which may be represented as $+I_{UND}$) flows in the opposite direction of the prior compensation current $-I_{UND}$ and generates a cancelling magnetic field (which may be represented as $+H_{cancel}$) which flows through the victim MTJ device 70' in the opposite direction of the prior cancelling magnetic field $-H_{cancel}$. Sequential application of $+H_{cancel}$ followed by $-H_{cancel}$ as depicted in FIG. 9b provides an oscillating cancelling magnetic field $H_{cancel}$ of similar magnitude at the victim MTJ device 70' but opposite polarity as the oscillating stray magnetic field $H_{stray}$ to provide a net applied magnetic field $H_{NET}$ at the victim MTJ device 70'. The net magnetic field $H_{NET}$ resulting from the full or partial cancelling of the stray magnetic field $H_{stray}$ by the canceling magnetic field $H_{cancel}$, may be of sufficiently small magnitude at the victim MTJ device 70' so as to reduce or eliminate switching of the bit value storage state of the victim MTJ device 70' due to row-hammering caused by the accessed row 102 (FIG. 6).

In the embodiment of FIG. 7, the word line $WL_{not\_access}$ of the row 100 not being accessed, is closer to the victim MTJ device 70' than is the word line $WL_{access}$ of the row 102 which is being accessed. As a result, in this embodiment, the magnitude $V_{UND}$ of the compensation control signal for the word line $WL_{not\_access}$ may be less than the magnitude of the access control signal $V_{ON}$ for the word line $WL_{access}$ of the row 102 which is being accessed. For example, in one embodiment, the magnitude $V_{UND}$ of the compensation control signal may be a function of the ratio of the distance $d_2$ to the distance $d_1$, such as magnitude $V_{UND}=V_{ON}*d_2/d_1$, for example. It is appreciated that other functions may be applied to determine appropriate compensation control signals in accordance with the present description.

Accordingly, the programmable word line driver 240 may be configured to provide appropriate compensation control signals to reduce or eliminate bitcell bit value storage state flipping due to row-hammer causing access to an adjacent row of bitcells. It is recognized that the net magnetic field $H_{NET}$ resulting from the full or partial cancelling of the stray magnetic field $H_{stray}$ by the canceling magnetic field $H_{cancel}$, need not be zero to reduce or eliminate such state flipping due to row-hammering caused by repeated access or other memory access patterns. As a result, the programmable word line driver 240 may be configured to provide compensation control signals of sufficient strength to reduce or eliminate state flipping, yet of relatively low power to conserve power consumption. Although the word line driver logic 240 is described in one embodiment as being programmable, it is appreciated that in other embodiments, the word line driver logic 240 may be of fixed configuration, depending upon the particular application.

FIG. 14 depicts another example of bitcell state retention operations which include another embodiment of magnetic field mitigation in accordance with the present description. In one operation, repeated memory access to a row of bitcells of MRAM may be detected (block 300) by the memory. If so, access to the row of bitcells is suspended (block 310) for an interval of time to terminate stray magnetic fields for the duration of the suspension interval to maintain bit value storage states of adjacent row of bitcells.

A word line driver circuit, such as the programmable word line driver logic 240 of the memory 66 of FIG. 13, may in one embodiment, be configured to detect repeated memory access to a row of bitcells of MRAM, and upon such detection, suspend memory access to the row of bitcells to terminate stray magnetic fields for the duration of the interval. In yet another embodiment, the programmable word line driver logic 240 may be configured to detect repeated memory access to a row of bitcells, and if repeated memory access is detected, to mitigate stray magnetic fields by generating a cancelling magnetic field in a manner similar to that described above in connection with FIG. 7. In still other embodiments, the programmable word line driver logic 240 may be configured to mitigate stray magnetic fields selectively by either suspending memory access to a row of bitcells being repeatedly accessed, or by generating a cancelling magnetic field, or both, depending upon the particular application.

Figure 15:
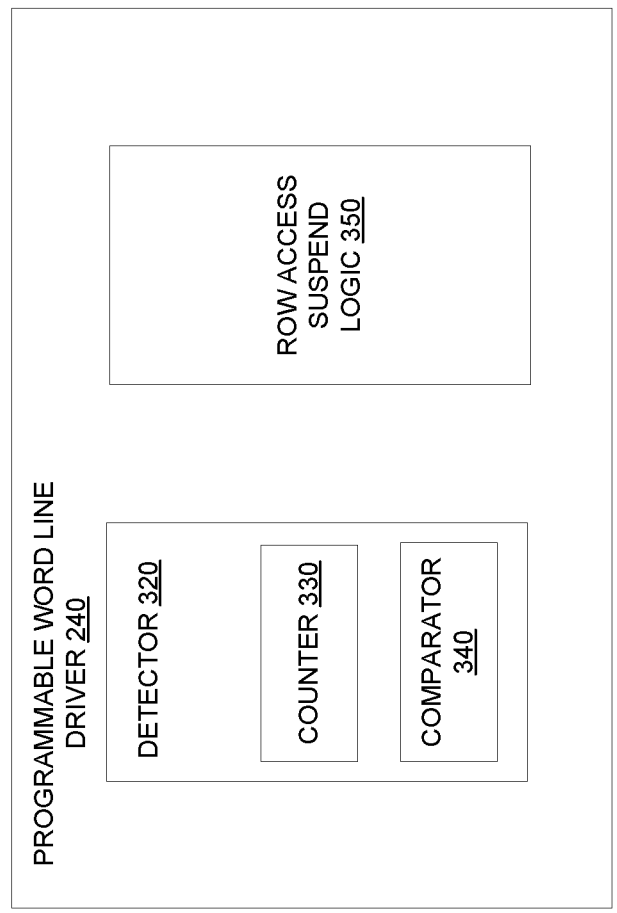
FIG. 15 is a more detailed schematic diagram of one embodiment of a programmable word line driver logic of the STTRAM memory of FIG. 13.

FIG. 15 depicts one example of a programmable word line driver logic 240 which includes a detector 320 configured to detect repeated memory access to a row of bitcells. Although the figure shows a single detector 320 for simplicity sake, it is appreciated that a word line driver may have multiple such detectors 320, each detector 320 available to detect repeated memory access for one or more associated word lines WL.

Figure 16:
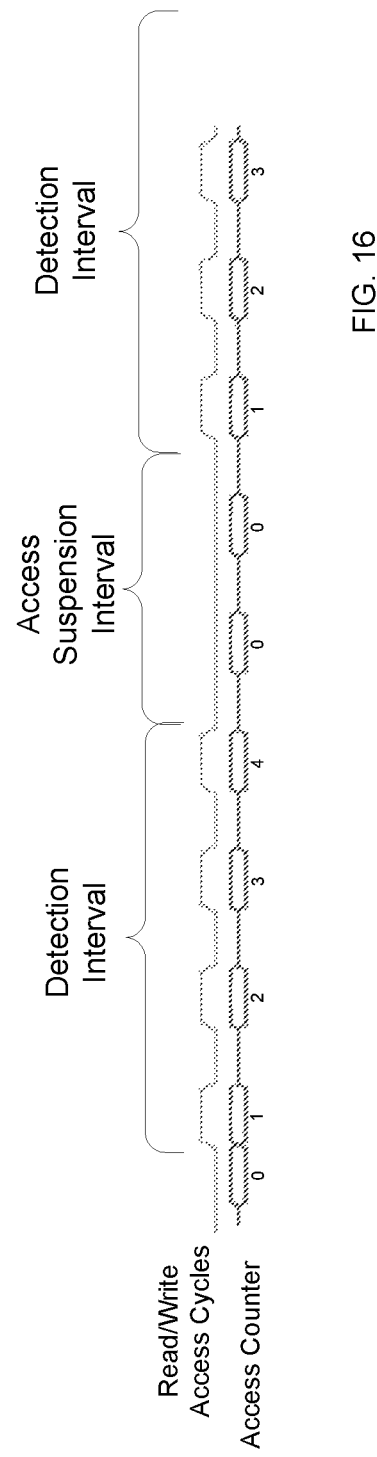
FIG. 16 is a graph depicting one example of operations of the programmable word line driver logic of FIG. 15.

The detector 320 includes a memory access counter 330 which keeps track of the pattern of memory access to a row being accessed. In this embodiment, the counter 330 counts consecutive memory accesses to the row being accessed as shown in FIG. 16. Thus, in the example of FIG. 16, four consecutive memory read or write access cycles are shown for a particular memory row during a detection interval. Each time the row is accessed in a consecutive memory access pattern, the output of the counter 330 is incremented. Conversely, if a memory access cycle is skipped during the detection interval, the counter is reset.

The detector 320 of FIG. 15 further includes a comparator 340 having a first input configured to receive a threshold value, a second input configured to receive the count output of the counter 330. The comparator 340 is configured to compare the output of the counter 330 to a threshold value which may be represented by the variable "N" and which may be programmable in some embodiments. In the example of FIG. 16, the comparator 340 has been programmed to compare the output of the counter 330 to a threshold value of N=4 consecutive memory access operations.

The word line driver logic 240 is configured to suspend access to the row being accessed as a function of the comparison of the count output of the memory access counter to the threshold value and as a function of an access suspension interval. Thus, if the output of the memory access counter 330 indicates that the row of bitcells has been accessed in four consecutive memory read or write operations, access to the row is suspended for an access suspension interval (FIG. 16) by a row access suspend logic 350 of the programmable word line driver 240. The duration of the access suspension interval period may be represented by the variable "M" where M represents a quantity of access cycles. Here too, although the figure shows a single suspend logic 350 for simplicity sake, it is appreciated that a word line driver may have multiple such suspend logics 350, each suspend logic 350 available to suspend memory access for one or more associated word lines WL.

In one embodiment, the duration M of the suspend period may be programmable. In the example of FIG. 16, the row access suspend logic 350 is programmed to suspend access to the row for an access suspension interval M=2 (two) memory access cycles. In another embodiment, the duration of the access suspension interval may be as few as M=1 (one) access cycle. It is appreciated that the duration of the access suspension interval may be longer or shorter, depending upon the particular application. Similarly, it is appreciated that the threshold value N of consecutive accesses for the comparator 340 may be greater than four or less than four, depending upon the particular application.

FIG. 17 depicts generation of oscillating stray magnetic fields by repeatedly accessing a row during the detection interval N=4. It is recognized herein that the oscillating stray magnetic fields generated by repeatedly accessing a row of STTRAM may cause the spin torque magnetization vector of one or more bitcells of an adjacent (not-accessed) row of STTRAM to begin to precess away from an original stable state. Thus, if the repeated access of the nearby row continues for a sufficient period of time as represented by a number of consecutive memory access cycles equal to the threshold value N, the magnetization vector of the MTJ device of the adjacent bitcell may precess sufficiently to flip the state of a bitcell of the not-accessed row. Because memory access to the row is suspended during the memory access suspension interval (that is, M=2 memory read/write access cycles) in this example, the generation of stray magnetic fields is terminated for the duration of the memory access suspension interval as shown in FIG. 17. In addition, the output of the memory access counter 330 is reset to zero for the duration of the memory access suspension interval as shown in FIG. 16.

It is recognized herein that if memory access to the row causing row-hammering is suspended prior to the bitcell state flipping to another stable state, the precession of the magnetization vector of the adjacent bitcell ceases and the precession of the magnetization vector reverses such that the state of the bitcell returns to its original stable state. In this manner, a temporary suspension of operation for the row causing row-hammering for a suspension window or interval of 'M' memory read/write access cycles, may be utilized to mitigate the spin torque precession and reduce the possibility of a bit value storage state flip as a result of a row-hammer causing access pattern. Accordingly, the bit value storage state is maintained as shown in FIG. 18. In some embodiments, it is believed that suspending memory access for as few as a single memory access cycle (M=1) may reduce or eliminate bitcell state flipping due to row-hammering.

Figure 19:
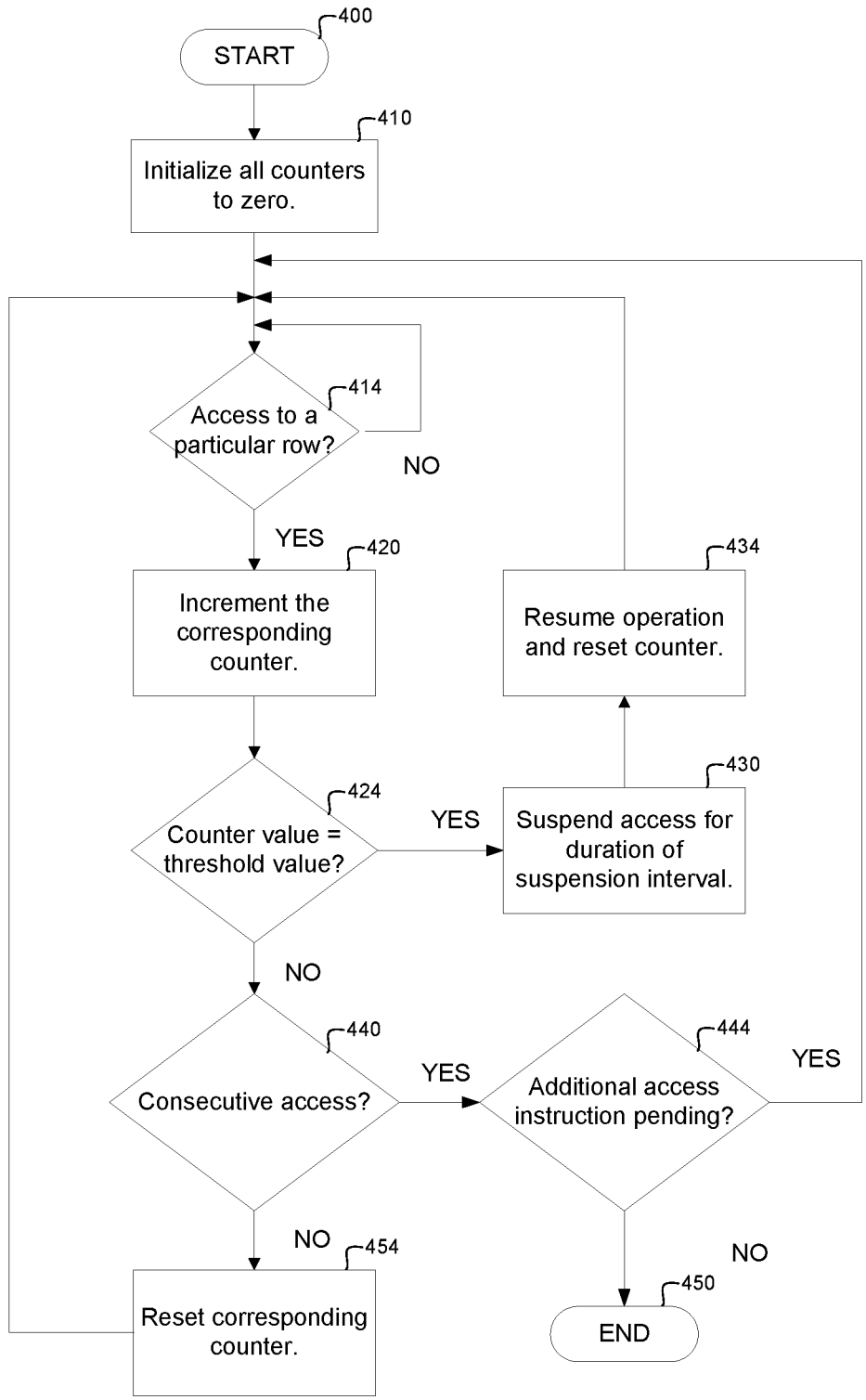
FIG. 19 is a flow chart depicting a more detailed example of the operations of the flow chart of FIG. 14, for stray magnetic field mitigation for bitcell bit value storage state retention in accordance with an embodiment of the present disclosure.

FIG. 19 depicts a more detailed example of bitcell state retention operations which mitigate stray magnetic fields by temporarily suspending memory read/write access to a row causing row-hammering. In this embodiment, upon start (block 400) of the operations, all memory access counters are initialized (block 410) to zero. In some embodiments, a memory access counter may be provided to count memory read/write access cycles for each memory row which is considered a likely source of row-hammering. Upon a determination (block 414) that one of these likely target rows is being accessed, the counter associated with the row being accessed may be incremented (block 420) by a suitable value. In the embodiment of FIG. 16, the corresponding memory access counter is incremented by a value equal to one. It is appreciated that in other embodiments, other incremental values, positive or negative, may be utilized, depending upon the particular application.

Upon incrementing the corresponding counter, a determination (block 424) is made as to whether the number of memory read/write access cycles represented by the memory access counter output has reached a threshold value. In the embodiment of FIG. 16, the threshold value is N=4 (four) memory read/write access cycles. It is appreciated that in other embodiments, other threshold values, positive or negative, may be utilized, depending upon the particular application.

If it is determined (block 424) that the number of memory read/write access cycles represented by the memory access counter output has reached the threshold value, further memory access to the row associated with the memory access counter is suspended (block 430) for the duration of an access suspension interval. In the embodiment of FIG. 16, the duration of the access suspension interval is M=2 (two) memory read/write access cycles. It is appreciated that in other embodiments, other suspension interval duration values, positive or negative, may be utilized, depending upon the particular application.

As previously mentioned, it is believed that suspension of memory access to the row causing row-hammering with consecutive memory access cycles, can cause precession of the magnetization vector of the adjacent bitcell to cease. In addition, the precession of the magnetization vector reverses such that the state of the bitcell returns to its original stable bit value storage state. In this manner, a temporary suspension of memory access operation for the row causing row-hammering for a suspension window or interval of 'M' memory read/write access cycles, may be utilized to mitigate the spin torque precession and reduce the possibility of a bit value storage state flip as a result of a row-hammer causing memory access pattern.

Following the access suspension interval, memory operation of the suspended row is resumed (block 434) and the memory access counter corresponding to the row is reset. If it is determined (block 424) that the number of memory read/write access cycles represented by the memory access counter output has not reached the threshold value, a further determination (block 440) is made as to whether the current access is a consecutive memory access. In one embodiment, a current memory access may be determined to be a consecutive memory access if a memory access occurred in the immediate prior memory read/write access cycle, and if so, if such prior memory access was to the same row as the current memory access. Thus, if the prior memory access was to the same row as the current memory access, and occurred in the memory read/write access cycle immediately prior to the memory read/write access cycle of the current memory access, the current memory access is determined (block 440) to be a consecutive memory access.

If the current memory access is determined (block 440) to be a consecutive access, a further determination (block 444) is made as to whether addition memory access instructions are pending. If no further memory access instructions are pending, it is determined that the pattern of memory access which includes the current access, is terminating. Accordingly, the stray magnetic field mitigation operations of FIG. 19 may end (block 450). Conversely if further memory access instructions are pending, it is determined that the pattern of memory access which includes the current memory access, may be continuing. Accordingly, control returns to test the next pending memory access operation as discussed above starting at the operation of block 414.

If the current memory access is determined (block 440) not to be a consecutive memory access, it is determined that the pattern of memory access which includes the current memory access is not a row-hammer causing pattern of memory access. Accordingly, the corresponding memory access counter of the row being accessed is reset (block 454), and the next memory access operation is tested as discussed above starting at the operation of block 414.

EXAMPLES

The following examples pertain to further embodiments.
Example 1 is an apparatus comprising:
an array of magnetoresistive (MRAM) bitcells having first and second rows of MRAM bitcells wherein each bitcell includes a ferromagnetic device having a polarization which in a first bit value storage state is one of parallel and anti-parallel polarization and in a second bit value storage state is the other of parallel and anti-parallel polarization; and
control circuitry configured to access a bitcell of the first row wherein said access generates a first magnetic field and wherein said control circuitry is further configured to mitigate a first magnetic field of the first row to maintain a bit value storage state of a bitcell of the second row.

In Example 2, the subject matter of Examples 1-8 (excluding the present Example) can optionally include wherein said control circuitry configured to mitigate a first magnetic field is configured to generate a second magnetic field in a bitcell of the second row to compensate for a first magnetic field wherein a first magnetic field of the first row is mitigated to maintain a bit value storage state of a bitcell of the second row.

In Example 3, the subject matter of Examples 1-8 (excluding the present Example) can optionally include wherein said MRAM bitcells are spin transfer torque (STT) random access memory (RAM) bitcells.

In Example 4, the subject matter of Examples 1-8 (excluding the present Example) can optionally include wherein said first row of bitcells has a first word line coupled to each bitcell of the first row, and said second row of bitcells has a second word line coupled to each bitcell of the second row, wherein said control circuitry configured to access a bitcell of the first row is configured to generate a first word line control signal of a first polarity on said first word line wherein said first word line control signal generates said first magnetic field, and
  wherein said control circuitry configured to generate a second magnetic field in a bitcell of the second row is further configured to generate a word line compensation control signal on said second word line and of a second polarity opposite that of the first polarity, to compensate for a first magnetic field, to maintain a bit value storage state of a bitcell of the second row.

In Example 5, the subject matter of Examples 1-8 (excluding the present Example) can optionally include wherein said control circuitry configured to generate a second magnetic field in a bitcell of the second row includes a programmable word line driver configured to generate a word line compensation control signal on said second word line wherein the magnitude of the said word line compensation control signal is programmable.

In Example 6, the subject matter of Examples 1-8 (excluding the present Example) can optionally include wherein said control circuitry configured to mitigate a first magnetic field includes a detector configured to detect repeated access to the first row and a driver configured to suspend access to the first row in response to said detection, wherein a first magnetic field of the first row is mitigated in response to said detection to maintain a bit value storage state of a bitcell of the second row.

In Example 7, the subject matter of Examples 1-8 (excluding the present Example) can optionally include wherein said control circuitry detector includes a counter having an output and configured to count consecutive accesses to the first row and output a count representative of the number of consecutive accesses to the first row, and a comparator having a first input configured to receive a threshold value, a second input configured to receive the count output of the counter, and configured to compare the count output of the counter to the threshold value, and wherein the control circuitry driver is configured to suspend access to the first row as a function of the comparison of the count output of the counter to the threshold value.

In Example 8, the subject matter of Examples 1-8 (excluding the present Example) can optionally include wherein the control circuitry is configured to access a bitcell of the first row in access cycles and wherein said control circuitry comparator is configured to be programmable to receive a programmable threshold value and to compare the count output of the counter to the programmable threshold value, and wherein the control circuitry driver is configured to be programmable to receive a programmable access cycle number value and to suspend access to the first row as a function of the comparison of the count output of the counter to the programmable threshold value, and the programmable access cycle number value.

Example 9 is directed to a computing system for use with a display, comprising:
  a memory;
  a processor configured to write data in and read data from the memory; and
  a video controller configured to display information represented by data in the memory;
  wherein the memory includes a magnetoresistive random access memory (MRAM), comprising:
  an array of magnetoresistive (MRAM) bitcells having first and second rows of MRAM bitcells wherein each bitcell includes a ferromagnetic device having a polarization which in a first bit value storage state is one of parallel and anti-parallel polarization and in a second bit value storage state is the other of parallel and anti-parallel polarization; and
  control circuitry configured to access a bitcell of the first row wherein said access generates a first magnetic field and wherein said control circuitry is further configured to mitigate a first magnetic field of the first row to maintain a bit value storage state of a bitcell of the second row.

In Example 10, the subject matter of Examples 9-16 (excluding the present Example) can optionally include wherein said control circuitry configured to mitigate a first magnetic field is configured to generate a second magnetic field in a bitcell of the second row to compensate for a first magnetic field wherein a first magnetic field of the first row is mitigated to maintain a bit value storage state of a bitcell of the second row.

In Example 11, the subject matter of Examples 9-16 (excluding the present Example) can optionally include wherein said MRAM bitcells are spin transfer torque (STT) random access memory (RAM) bitcells.

In Example 12, the subject matter of Examples 9-16 (excluding the present Example) can optionally include wherein said first row of bitcells has a first word line coupled to each bitcell of the first row, and said second row of bitcells has a second word line coupled to each bitcell of the second row, wherein said control circuitry configured to access a bitcell of the first row is configured to generate a first word line control signal of a first polarity on said first word line wherein said first word line control signal generates said first magnetic field, and
  wherein said control circuitry configured to generate a second magnetic field in a bitcell of the second row is further configured to generate a word line compensation control signal on said second word line and of a second polarity opposite that of the first polarity, to compensate for a first magnetic field, to maintain a bit value storage state of a bitcell of the second row.

In Example 13, the subject matter of Examples 9-16 (excluding the present Example) can optionally include wherein said control circuitry configured to generate a second magnetic field in a bitcell of the second row includes a programmable word line driver configured to generate a word line compensation control signal on said second word line wherein the magnitude of the said word line compensation control signal is programmable.

In Example 14, the subject matter of Examples 9-16 (excluding the present Example) can optionally include wherein said control circuitry configured to mitigate a first magnetic field includes a detector configured to detect repeated access to the first row and a driver configured to suspend access to the first row in response to said detection, wherein a first magnetic field of the first row is mitigated in response to said detection to maintain a bit value storage state of a bitcell of the second row.

In Example 15, the subject matter of Examples 9-16 (excluding the present Example) can optionally include wherein said control circuitry detector includes a counter having an output and configured to count consecutive accesses to the first row and output a count representative of the number of consecutive accesses to the first row, and a comparator having a first input configured to receive a threshold value, a second input configured to receive the count output of the counter, and configured to compare the count output of the counter to the threshold value, and wherein the control circuitry driver is configured to suspend access to the first row as a function of the comparison of the count output of the counter to the threshold value.

In Example 16, the subject matter of Examples 9-16 (excluding the present Example) can optionally include wherein the control circuitry is configured to access a bitcell of the first row in access cycles and wherein said control circuitry comparator is configured to be programmable to receive a programmable threshold value and to compare the count output of the counter to the programmable threshold value, and wherein the control circuitry driver is configured to be programmable to receive a programmable access cycle number value and to suspend access to the first row as a function of the comparison of the count output of the counter to the programmable threshold value, and the programmable access cycle number value.

Example 17 is directed to a method of operating a magnetoresistive random access memory (MRAM), comprising:
  accessing a first row of an array of magnetoresistive (MRAM) bitcells wherein each bitcell includes a ferromagnetic device having a polarization which in a first bit value storage state is one of parallel and anti-parallel polarization and in a second bit value storage state is the other of parallel and anti-parallel polarization and wherein said accessing includes generating a first magnetic field; and
  mitigating a first magnetic field of the first row to maintain the bit value storage states of a second row.

In Example 18, the subject matter of Examples 17-24 (excluding the present Example) can optionally include wherein said mitigating a first magnetic field includes generating a second magnetic field in a bitcell of the second row to compensate for a first magnetic field wherein a first magnetic field of the first row is mitigated to maintain a bit value storage state of a bitcell of the second row.

In Example 19, the subject matter of Examples 17-24 (excluding the present Example) can optionally include said MRAM bitcells are spin transfer torque (STT) random access memory (RAM) bitcells.

In Example 20, the subject matter of Examples 17-24 (excluding the present Example) can optionally include wherein said first row of bitcells has a first word line coupled to each bitcell of the first row, and said second row of bitcells has a second word line coupled to each bitcell of the second row, wherein said accessing a first row includes generating a first word line control signal of a first polarity on said first word line wherein said first word line control signal generates said first magnetic field, and wherein said generating a second magnetic field in a bitcell of the second row includes generating a word line compensation control signal on said second word line and of a second polarity opposite that of first polarity, to compensate for a first magnetic field, to maintain a bit value storage state of a bitcell of the second row.

In Example 21, the subject matter of Examples 17-24 (excluding the present Example) can optionally include wherein said generating a word line compensation control signal on said second word line includes programming the magnitude of the word line compensation control signal.

In Example 22, the subject matter of Examples 17-24 (excluding the present Example) can optionally include wherein said mitigating a first magnetic field includes detecting repeated access to the first row and suspending access to the first row in response to said detecting, wherein a first magnetic field of the first row is mitigated in response to said detection to maintain a bit value storage state of a bitcell of the second row.

In Example 23, the subject matter of Examples 17-24 (excluding the present Example) can optionally include wherein said detecting includes counting consecutive accesses to the first row and comparing a count output to a threshold value, and wherein the suspending includes suspending access to the first row as a function of the comparison of the count output to the threshold value.

In Example 24, the subject matter of Examples 17-24 (excluding the present Example) can optionally include wherein the accessing a first row includes accessing the first row in access cycles and wherein the comparing includes programming a programmable threshold value and an access cycle number value, and comparing the count output to the programmable threshold value, and wherein the suspending includes suspending access to the first row as a function of the comparison of the count output to the programmable threshold value and as a function of the programmable access cycle number value.

Example 25 is directed to an apparatus comprising means to perform a method as described in any preceding Example.

The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art. Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information from a memory to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. An apparatus comprising:
   a magnetoresistive random access memory (MRAM) array having first and second rows of bitcells, respective bitcells separately including a ferromagnetic device having a polarization that indicates a first or a second bit value storage state;
a first word line coupled with bitcells of the first row;
a second word line coupled with bitcells of the second row; and
control circuitry including logic, the logic to:
  cause an access to a bitcell of the first row, the access to generate a first magnetic field;
  cause a second magnetic field to be generated in the bitcell of the second row to compensate for the first magnetic field to mitigate an impact of the first magnetic field on the bit value storage state of the bitcell of the second row;
  generate a first word line control signal of a first polarity on the first word line, the first word line control signal to cause the first magnetic field;
  generate a word line compensation control signal of a second polarity on the second word line to cause the second magnetic field to be generated in the bitcell of the second row to compensate for the first magnetic field;
  determine whether the access to the bitcell of the first row causes a count of consecutive accesses to the bitcell of the first row to exceed a threshold value; and
  suspend one or more subsequent accesses to the bitcell of the first row for a suspension interval if the count exceeds the threshold value, to mitigate an impact of the first magnetic field on a bit value storage state of the bitcell of the second row.

2. The apparatus of claim 1, further comprising a programmable word line driver to generate the word line compensation control signal, a magnitude of the word line compensation control signal is programmable.

3. The apparatus of claim 1, the MRAM array comprises a spin transfer torque (STT) MRAM (STT-MRAM) array.

4. A system comprising:
a display;
a memory;
a processor to write data in and read data from the memory; and
a video controller to display information to the display based on data in the memory;
wherein the memory includes:
  a magnetoresistive random access memory (MRAM) array having first and second rows of bitcells, respective bitcells separately including a ferromagnetic device having a polarization that indicates a first or second bit value storage state;
a first word line coupled with bitcells of the first row;
a second word line coupled with bitcells of the second row; and
  control circuitry including logic, the logic to:
    cause an access to a bitcell of the first row, the access to generate a first magnetic field;
    cause a second magnetic field to be generated in the bitcell of the second row to compensate for the first magnetic field to mitigate an impact of the first magnetic field on the bit value storage state of the bitcell of the second row
    generate a first word line control signal of a first polarity on the first word line, the first word line control signal to cause the first magnetic field;
    generate a word line compensation control signal of a second polarity on the second word line to cause the second magnetic field to be generated in the bitcell of the second row to compensate for the first magnetic field;
    determine whether the access to the bitcell of the first row causes a count of consecutive accesses to the bitcell of the first row to exceed a threshold value; and
    suspend one or more subsequent accesses to the bitcell of the first row for a suspension interval if the count exceeds the threshold value, to mitigate an impact of the first magnetic field on a bit value storage state of the bitcell of the second row.

5. The system of claim 4, comprising a programmable word line driver to generate the word line compensation control signal, a magnitude of the word line compensation control signal is programmable.

6. The system of claim 4, the MRAM array comprises a spin transfer torque (STT) MRAM (STT-MRAM) array.

7. A method comprising:
accessing a bitcell of a first row of bitcells of a magnetoresistive random access memory (MRAM) array having first and second rows of bitcells, respective bitcells separately including a ferromagnetic device having a polarization that indicates a first or second bit value storage state, the access to generate a first magnetic field, a first word line is coupled with bitcells of the first row and a second word line is coupled with bitcells of the second row;
causing a second magnetic field to be generated in the bitcell of the second row to compensate for the first magnetic field to mitigate an impact of the first magnetic field on the bit value storage state of the bitcell of the second row;
generating a first word line control signal of a first polarity on the first word line, the first word line control signal to cause the first magnetic field;
generating a word line compensation control signal of a second polarity on the second word line to cause the second magnetic field to be generated in the bitcell of the second row to compensate for the first magnetic field;
determining whether the access to the bitcell of the first row causes a count of consecutive accesses to the bitcell of the first row to exceed a threshold value; and
suspending one or more subsequent accesses to the bitcell of the first row for a suspension interval if the count exceeds the threshold value, to mitigate an impact of the first magnetic field on a bit value storage state of the bitcell of the second row.

8. The method of claim 7, the word line compensation control signal having a magnitude that is programmable.

9. The method of claim 7, the MRAM array comprises a spin transfer torque (STT) MRAM (STT-MRAM) array.

10. The apparatus of claim 1, wherein the access to the bitcell is a read operation.

11. The apparatus of claim 1, wherein the suspension interval is a number of memory access cycles.

12. The apparatus of claim 11, wherein the number of memory access cycles is at least 2.

13. The system of claim 4, wherein the access to the bitcell is a read operation.

14. The system of claim 4, wherein the suspension interval is a number of memory access cycles.

15. The system of claim 14, wherein the number of memory access cycles is at least 2.

16. The method of claim 7, wherein accessing the bitcell is a read operation.

17. The method of claim 7, wherein the suspension interval is a number of memory access cycles.

18. The method of claim 17, wherein the number of memory access cycles is at least 2.

* * * * *